Figure 1:
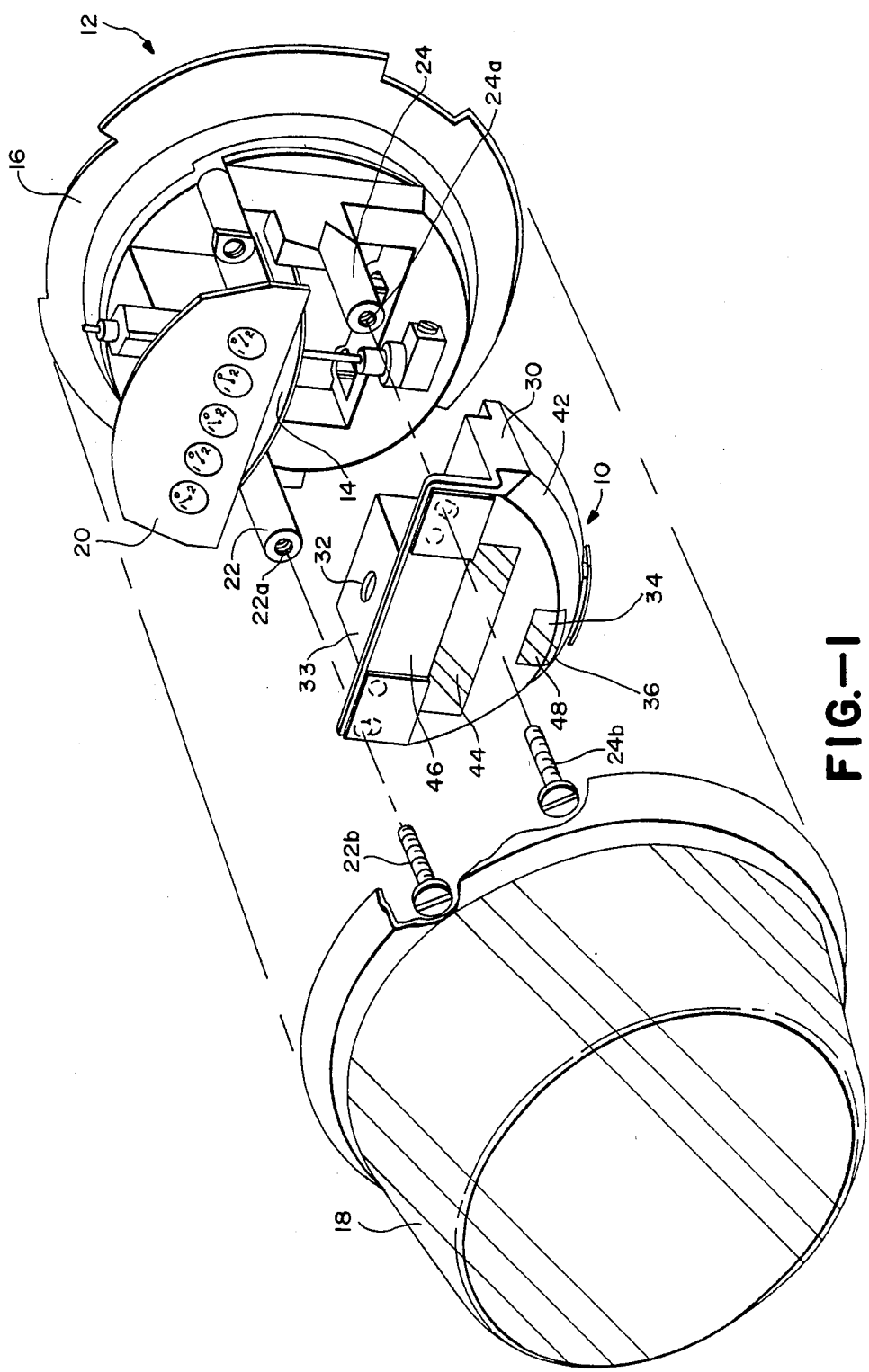

United States Patent [19]

Edwards et al.

[11] Patent Number: 4,792,677
[45] Date of Patent: Dec. 20, 1988

[54] SYSTEM FOR USE WITH A UTILITY METER FOR RECORDING TIME OF ENERGY USE

[75] Inventors: Cree A. Edwards, Belmont; Larsh M. Johnson, San Francisco, both of Calif.

[73] Assignee: Domestic Automation Company, Inc., Foster City, Calif.

[21] Appl. No.: 902,161

[22] Filed: Aug. 29, 1986

[51] Int. Cl.$^4$ ................. G08C 19/02; G01D 5/34
[52] U.S. Cl. .................... 250/231 SE; 340/870.29
[58] Field of Search ............ 250/231 SE; 340/870.02, 340/870.28, 870.29; 364/483; 324/116

[56] References Cited

U.S. PATENT DOCUMENTS

| | | | |
|---|---|---|---|
| 3,683,343 | 8/1972 | Feldman et al. | 340/178 |
| 3,820,073 | 7/1974 | Vercellotti et al. | 340/151 |
| 4,050,020 | 9/1077 | Germer et al. | 324/116 |
| 4,119,948 | 10/1978 | Ward et al. | 340/151 |
| 4,120,031 | 10/1978 | Kincheloe et al. | 364/464 |
| 4,132,981 | 1/1979 | White | 340/203 |
| 4,166,975 | 9/1979 | Germer et al. | 324/116 |
| 4,179,654 | 12/1979 | Germer | 324/116 |
| 4,298,839 | 11/1981 | Johnston | 324/157 |
| 4,315,248 | 2/1982 | Ward | 340/825.72 |
| 4,350,980 | 9/1982 | Ward | 340/870.29 |
| 4,415,853 | 11/1983 | Fisher | 324/74 |
| 4,463,354 | 7/1984 | Sears | 340/870.02 |
| 4,465,970 | 8/1984 | DiMassimo et al. | 324/116 |
| 4,489,384 | 12/1984 | Hurley et al. | 250/231 SE |
| 4,516,213 | 5/1985 | Gidden | 364/483 |

*Primary Examiner*—David C. Nelms
*Assistant Examiner*—Stephone B. Allen
*Attorney, Agent, or Firm*—Flehr, Hohbach, Test, Albritton, & Herbert

[57] ABSTRACT

A system for use with standard electric meters having a rotatable disc for recording time of energy use. The system includes a housing securable within a meter below the disc. The system also includes sensor means within the housing for detecting rotation of the disc and generating a signal in response thereto. Circuit means are included within the housing to process and store the signal for calculating time of energy use information. The housing also includes a communication circuit means for transmitting the time of energy use information to a location external of the meter.

18 Claims, 3 Drawing Sheets

FIG.—1

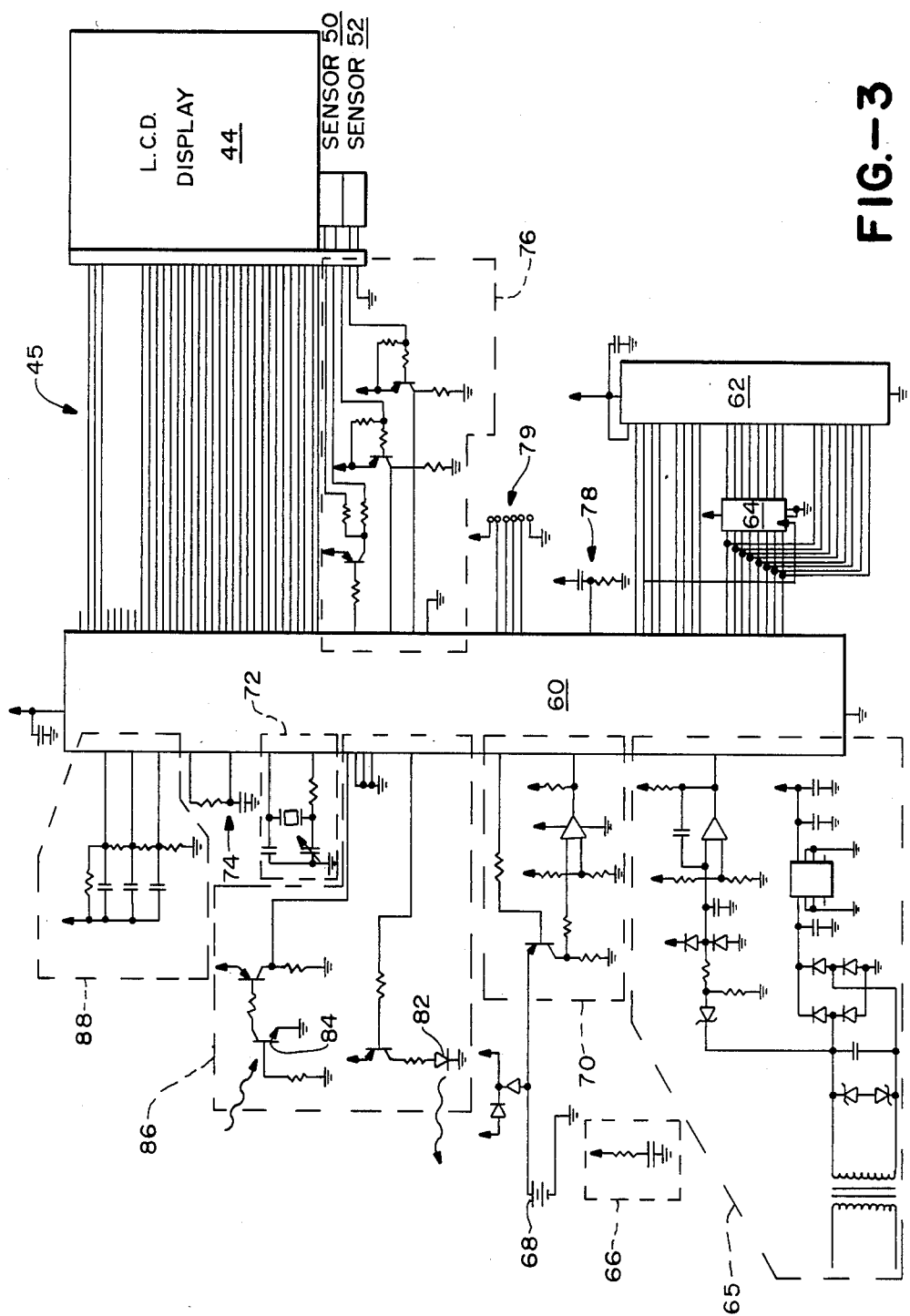

SYSTEM FOR USE WITH A UTILITY METER FOR RECORDING TIME OF ENERGY USE

The present invention relates generally to meters for recording energy consumption, and more particularly to a system for use with standard electric meters for recording time of energy use, demand and load profile data.

Electrical energy is generally sold and metered on the basis of a fixed rate schedule, for example a fixed rate per kilowatt-hour delivered. Electrical energy demand, however, varies considerably during the course of the day. Nonetheless, the fixed rate applies whether the demand for energy is high or low.

Since there are peak and slow periods occurring at differett times of the day, electrical distribution and generation systems are overloaded at certain times and underutilized at other times. This results in substantial inefficiencies as a much larger generation and distribution system than is economically desirable is required to meet the peak demands. Additionally, the low demand consumer is in effect subsidizing the high demand consumer as they are both charged the same rate for power consumption.

Various attempts have been made in the past to spread the demand for energy over greater portions of the day. For instance, clock mechanisms have been utilized for decreasing the flow of electricity during peak load periods. These systems, however, have been found to be impractical due to the necessity of frequent checking and setting of the clock switching mechanism at the various consumer locations, and due to the inability to predict peak demand load intervals and to then change the clock mechanism's timing on a relatively simple basis to track such intervals.

Multiple rate structures have also been utilized in an effort to spread the demand for energy. Consumers using electrical energy during low demand periods are charged a lower rate than consumers using energy during high demand periods. The multiple rate structure thus provides an economic incentive for consumers to use electrical energy during low demand periods, thereby leveling the load requirements placed on the generation system.

Multiple rate structures have been satisfactorily utilized for large commercial and industrial consumers. However, they have more or less proved impractical for residential consumers due to the high cost of replacing existing electric meters with new electric meters capable of metering power consumption by time of use.

Examples of metering systems capable of registering different amounts of power consumed during different intervals of the day include a two-stage mechanical watt meter having a clock timer. Cams on the clock timer trip a mechanism which, at selected times, permit the driving of one set of meter dials or the other so that power consumption, during a selected portion of the day, could be registered by the first set of dials, while power consumed during the other portion of the day could be registered by the second set of dials. See U.S. Pat. No. 2,139,821.

Another system utilized dual rate meters wherein a clock determined which set of meters were to be activated. See U.S. Pat. Nos. 2,132,256 and 2,246,185.

Still another type of meter included three sets of decade gear driven dials for registering kilowatt hours consumed on a continuous basis, kilowatt hours consumed during mid-peak periods, and kilowatt hours consumed during high-peak periods. A programmable control circuit controlled the operation of the dials by activating the desired set at a predetermined time. The time period selection was based on time internally generated in 15 minute increments on a weekly cycle. See U.S. Pat. No. 4,050,020.

Time-of-day demand meters measure and record power consumption on a demand meter register during demand intervals of predetermined lengths. The demand register is capable of being engaged at the start of a demand interval, as determined by a program in the meter, and disengaged to terminate the demand interval as determined by an interval counter. The demand intervals occur at fixed times throughout the day. See U.S. Pat. No. 4,179,654.

A variation of this type of meter provides for metering electrical energy consumption at multiple rates depending on the time of day, time of week and time of year. See U.S. Pat. No. 4,465,970.

Another example of a meter having a programmable time based measuring system is found in U.S. Pat. No. 4,465,970. The meter includes a transparent communications window for receiving and transmitting coded radiations into and from a radiation sensitive external data interface.

Excellent, highly-standardized, electromechanical meters for metering power consumption at fixed rates are currently in place at literally millions of locations throughout the United States. These meters are readily available and relatively inexpensive. Examples of such meters include: the D5S meter type manufactured by the Westinghouse Corporation, Raleigh, N.H.; the I-70-S meter type manufactured by the General Electric Corporation, Somersworth, N.H.; the MS meter type manufactured by Landis & Gyr (Duncan), Lafayette, Ind.; and the J4 meter type manufactured by Sangamo, Atlanta, Ga. The above-identified General Electric, Landis & Gyr, and Sangamo meters have been manufactured since at least 1970.

Thus, the most practical and inexpensive way to provide for a multiple rate structure is to provide a system for recording time of energy use that is readily utilized with such standard electric meters.

One example of such a system is disclosed in U.S. Pat. No. 4,516,213. This system includes a first unit mounted inside the casing of the electric meter and a second unit mounted in a portable casing that can be brought in close proximity with the first unit by a meter reader. The first unit includes a phototransistor for detecting the rotation of the meter's eddy current disc. The first unit also includes a microprocessor for maintaining a clock for the time of day and a calendar for the date, and a light emitting diode and phototransistor for communicating with the second unit. The second unit also includes a microprocessor, and a light emitting diode and phototransistor for communicating with the first unit.

U.S. Pat. No. 4,415,853 discloses the use of two reflective scanners mounted on the outside of an elcctric meter for detecting the revolutions of the eddy current disc. A signal is emitted and amplified, and fed into a counting device. The counting device includes a memory and in conjunction with a printer prints the time of day, the date, and number of revolutions of the rotating disc. This information is stored in a memory for a given unit of time.

A general object of the present invention is to provide a relatively inexpensive system readily usable on standard utility meters for recording time of energy use, demand and load profile data.

Another object of the present invention is to provide a system for recording time of energy use, demand and load profile data and for transferring that information to a reader means that may be programmed to calculate a rate for energy use.

The present invention is directed to a system for use with standard watthour meters having a rotatable disc for recording energy use. The system is capable of recording time of energy use from which energy bills can be calculated based upon time of use energy rates.

The system comprises a housing configured to fit within the meter beneath the disc. The system further includes a sensor means located within the housing for detecting rotation of the disc and generating a signal in response thereto. Circuit means are also included within the housing for processing and storing the signal for determining time of energy use. Communication circuit means are included within the housing for transmitting the time of energy use information to a location external of the meter.

Figure 2:
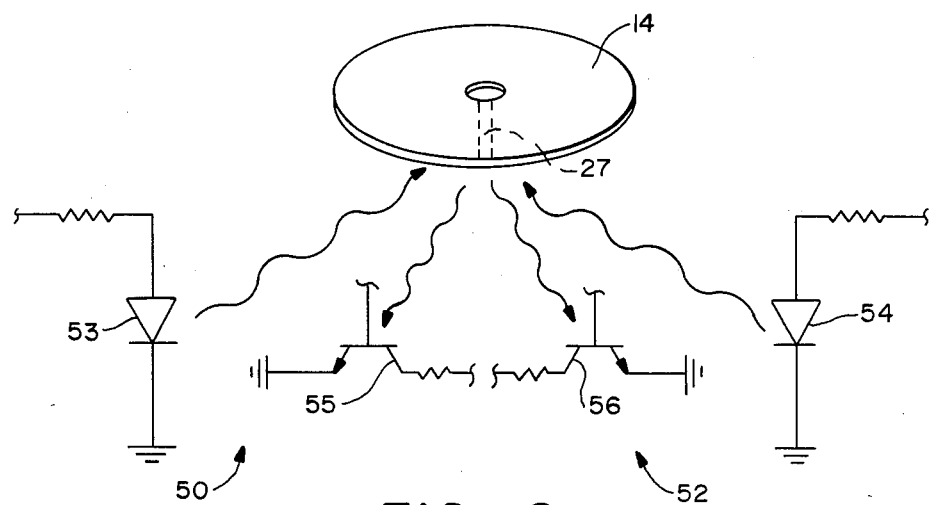
Figure 4:
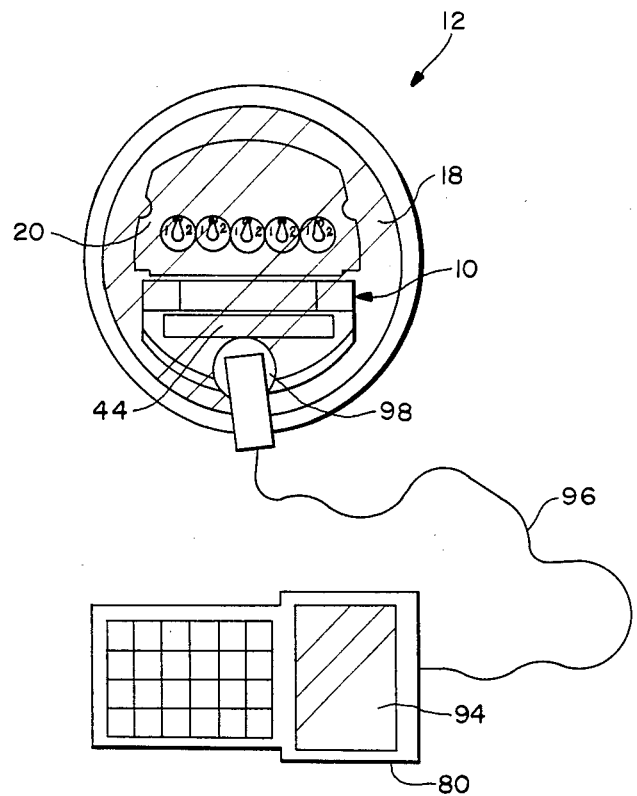

The system of the present invention will be described in more detail hereinafter in conjunction with the drawings wherein:

FIG. 1 is a perspective view illustrating the housing device of the system of the present invention being mounted to a standard electric meter;

FIG. 2 schematically illustrates a sensor of the system of the present invention;

FIG. 3 is a schematic circuit diagram for an embodiment of the system of the present invention; and FIG. 4 is a schematic view of a reader of the system of the present invention as coupled to a meter enclosure;

Referring now to the drawings, reference is first made to FIG. 1. This figure illustrates the housing device of the present invention, indicated generally by reference numeral 10, being mounted to an electric meter 12. The meter is a single stator watthour meter that includes an Eddy current disc or meter wheel 14. The disc revolves at a rate proportional to energy throughput such that each disc revolution or half revolution represents a specific quantity of metered energy consumption.

Meter 12 further includes a base 16 and a transparent cup-shaped cover 18 securable to the base. The cover provides an enclosure for the meter. It is normally made of a transparent glass or impact-resistant plastic material that protects the meter from environmental conditions and that prevents unauthorized access. The mechanical dial register 20 of meter 12 is visible through the meter cover. The dial register indicates the total number of kilowatt hours consumed, and thus provides a measure of electrical energy consumption. The watthour metering movement that is part of the meter is not shown in any detail as the construction of the movement is well known to those skilled in the art.

Device 10 of the present invention is configured to be mounted within the following Class 200, 60 Hz watthour meters as well as other meters having a similar internal structure: the D5S meter type manufactured by the Westinghouse Corporation, Ralegh, N.H.; the I-70-S meter type manufactured by the General Electric Corporation, Somersworth, N.H.; the MS meter type manufactured by Landis & Gyr (Duncan), Lafayette, Ind.; and the J4 meter type manufactured by Sangamo, Atlanta, Ga. Meters of the type just identified, including meters having a similar internal structure, will be hereinafter referred to as a standard watthour or standard electric meters.

These meters normally include either one or two mounting posts on which an identification plate is mounted within the meter enclosure. The identification plate, as is well known in the art, carries information such as the meter's model number, a utility identification number, and a manufacturer's serial number.

A Landis & Gyr MS type meter is illustrated in FIG. 1. It includes two mounting posts 22 and 24 disposed more or less on opposite sides of the meter structure. The mounting posts include respective threaded openings 2a and 24a designed to receive a threaded member such as screws 22b and 24b.

The Sangamo J5S type meter, which is not illustrated, includes a single mounting post substantially located at the midline of the meter near its center. The identification plate is normally mounted to this post. The mounting post also includes two locating pins for engaging respective openings in the identification plate.

Two of the other types of standard electric meters, the Westinghouse and General Electric meters, mount the identification plate in a manner like that of the Landis & Gyr MS meter. However, the spacing between the mounting posts for each of these meters differs from the Landis & Gyr meter as well as from each other.

The construction of device 10 and additional details regarding the construction of the various standard electric meters are described in more detail in our co-pending patent application entitled "A Device for Use With A Utility Meter For Recording Time of Energy Use", assigned to the assignee of this application, and which co-pending application is hereby incorporated by reference.

The system of the present invention is capable of recording time of energy use, peak demand for energy, and energy load profile data. It is usable with standard watthour meters of the types heretofore described. The present invention is also capable of turning an appliance on or off through a direct wired relay switch. The timing for this relay can be set to be independent of the time of use periods.

The device records time of energy use, peak demand and energy load profile data by detecting the rotation of the meter's disc. To this end, an opaque mark 27 (see FIG. 2) is located on the lower surface of disc 14. The mark is preferably at least ⅛ inch wide and may be formed by a paint-type marking pen. Sensor means are mounted within housing 30 of device 10 to detect the black mark as it rotates past an optical port 32 in the top surface 33 of housing 30.

As shown schematically in FIG. 2, the sensor means may comprise two infrared sensors, represented generally by reference numerals 50, 52. The sensors are positioned next to each other in a line parallel to the face of the meter, so line 27 crosses over one sensor, then the next sensor, as disc 14 rotates. Each of the sensors include an infrared light-emitting diode 53, 54 and a phototransistor 55, 56 that generate a signal in response to the passage of mark 27 on disc 14 past optical port 32.

When device 10 is positioned within the meter, the light emitting diodes can beam infrared light onto the disc's lower surface that is reflected back to the respective phototransistors. This produces a signal that is monitored by a microcomputer 60 that is part of the circuitry of the system of the present invention and which is located within housing 30 of device 10 (see FIG. 3). The rotating black mark interrupts reflection of infrared light, once each revolution, causing a change in the phototransistor signal. The positioning of the two infrared sensors ensures that the microcomputer will not count false signals caused by vibration. It also provides the ability to determine the direction of disc revolution.

The energy consumption information gathered by device 10 may thereafter be collected by use of a portable, electronic, meter reader 80 (see FIG. 4). The meter reader may be programmed to calculate a utility usage charge using different billing rates for different times of the day, week, or year. The information recorded by device 10 is transmitted to the meter reader through optical data port 34 located in faceplate 42 of device 10. The faceplate also includes an optical filter 48 for filtering out non-infrared light that would otherwise enter optical port 34.

The meter reader may communicate with device 10 by means of an infrared serial transmitter and receiver. An infrared light source and receiver means, discussed in more detail below, may be located within housing 30 for communicating with meter reader 80. Infrared light is transmitted through the meter's glass cover 18 with sufficient intensity to be received on the opposite side. The glass cover thus does not have to be replaced.

The device 10 may further include a liquid crystal display ("LCD") 44 to provide meter information to the consumer and the utility by a direct view of the device through the meter's cover. The meter may thus also be read visually by a meter reader.

The LCD 44 is connected by a flexible, electrical cable 45 (see FIG. 3) to the circuitry of device 10. The use of a flexible cable permits LCD 44 to be flipped out of the way, if necessary, when mounting device 10 to a meter.

The system is of the present invention microprocessor controlled and includes a clock-calendar. In a preferred embodiment, as shown in FIG. 3, microprocessor 60 comprises a single-chip, 4K byte microcomputer type 7514 available from Nippon Electric Corporation, Mountain View, Calif. Microprocessor 60 contains a read-only-memory (ROM) a limited random-access-memory (RAM), a timer, an LCD display controller, a clock, a calendar, and input/output ports. The ROM provides the firmware that controls operation of the microprocessor. The limited RAM, type TC5564 from Toshiba, America, Inc., Tustin, Calif. provides for the storage of data. A RAM 62 connected to microprocessor 60 via latch 64, for example a type 74-HC-373 available from Toshiba America, Inc., Tustin, Calif., provides 8K bytes of additional data storage. The RAMs store the energy use information.

Power for the system controlled by microprocessor 60 is provided through power supply circuit 65. Power supply circuit 65 operates off the incoming power line to the consumer location, converting a 240 volt AC signal to a 5 volt DC signal. Circuit 65 also includes a 60 Hz filter that provides a 60 Hz digital signal to microprocessor 60 so that the microprocessor is clocked in synchronization with the 60 Hz incoming power. The 60 Hz signal is also utilized for power failure detection.

Microprocessor 60 includes an internal clock unit to provide timing signals for its internal operation. The time of day in hours, minutes, and seconds, the time of the week, and the time of the year may be maintained and stored in the microprocessor. As noted, the microprocessor is clocked in synchronization with the 60 Hz power supply via circuit 65.

An RC oscillator 74 is provided for microprocessor operation (system clock).

In the case of an electrical power outage, microprocessor 60 is powered by a battery 68 connected in circuit with the microprocessor and a battery test circuit 70. Circuit 70 periodically turns on the battery to test it against a reference voltage to determine whether battery replacement is needed. Battery backup is utilized when the power line voltage drops by 20 percent or more.

The system also includes a capacitor circuit 66, including a capacitor having a capacitance of 0.22 Farads, as backup power for microprocessor 60. Most power outages are of relatively short duration, only a few hours for example. During this period, the capacitor would provide power for up to about one day. This will have the effect of retaining battery life. During longer power outages, after the capacitor is drained, backup power would come from the battery. It is expected that the backup power supply may last as long as 10 years with a backup battery and for a longer period with the capacitor circuit, assuming that power down periods are of a duration that do not drain the capacitor completely.

During power interruption, time keeping by the microprocessor 60 is accomplished with a 32 KHz clock circuit 72. This clock circuit is also used for serial bit timing for data transmission between meter reader 80 and microprocessor 60.

Sensors 50, 52 produce a signal that is periodically monitored by microprocessor 60 by accumulation of a pulse count from phototransistors 55, 56 (see FIG. 2) for different predetermined time periods.

Sensors 50, 52 are connected to the microprocessor through a sensor circuit 76. The sensor circuit provides for intermittent operation of light emitting diodes 53, 54. The light emitting diodes are operated so that they are pulsed on for less than 1/10 millisecond at a rate synchronized with the AC power supply timing signal. The infrared light emitted by light emitting diodes 53, 54 is reflected by the rotating disc and detected by phototransistor 55, 56. The signals are amplified by the sensor circuit 76 and then are fed to the microprocessor 60.

The system provides time of use, demand, and load profile metering capability. In a preferred embodiment, energy consumption, as recorded by means of sensors 50, 52, is accumulated in microprocessor 60.

The microprocessor stores time of use (TOU) information in four time of day memory locations. The information is stored as disc revolutions. A separate location is used to store TOU information for weekends and holidays. The TOU information is segregated by seasons. The information includes: total Kilowatt hours (Kwh) on the meter, total Kwh in each of the four TOU periods, and the total Kwh weekend and holiday energy usage. A seasonal snapshot from previous seasons is also stored.

The demand or rate of energy use is also recorded. The demand interval may be set to 1, 2, 3, 5, 10, 15, 20, 30, or 60 minutes. The demand periods correspond to TOU periods. The microprocessor also includes a demand delay or grace period programmable from 0 to 255 minutes to account for demand after a power outage. Additionally, demand may be reset on a season change date.

The following demand information may be read from the LCD continuous cumulative demand for each of the four TOU periods, peak demand during each period, date and time of last demand reset, and date and time of peak demand for each period. Additional demand information that may be read by meter reader 80 includes: time remaining in current demand period, demand over last complete interval, and all demand information for last season.

The microprocessor is programmable to accumulate load profile data for 140 days of hourly or 35 days of 15 minute data. The meter reader 80 can read the following load profile data: load profile history, and time, date and duration of power outages.

The microprocessor is also programmed to include meter identification information—up to 16 alphanumeric characters of which nine numeric characters are LCD readable. The microprocessor is programmable to provide the following settings for different meters: time, date and Kh constant, which relates disc rotations to Kwh. The Kh constant is programmable to the following settings for different meters: 0.3, 0.6, 1.2, 1.8, 2.4, 3.6, 4.8, 7.2, 10.8, 14.4, 21.6, 28.8, 43.2, and 57.6.

The microprocessor includes a calendar for special dates such as holidays, daylight savings time and changeover dates. Up to 170 of such dates (enough for 20 years), may be programmed into the microprocessor. The following power outage information which is stored in the load profile memory may also be read: definable length of official power outages, time on battery backup (hours minutes and seconds), number and time of power outages, and reset of battery backup and power outage information.

The system may also provide a load control function. The start and end of load control periods may be independent of TOU periods. Customers may be alerted to on-or-off peak periods and a demand threshold customer alert may be provided. The polarity of load control is programmable.

As noted heretofore, visual readout for the values measured, totaled and stored in the memory of the microprocessor may be seen at visual display 44. The display may comprise 9 numerical display elements each including 7 conductive segments. An LCD biasing circuit 88 connected in circuit with microprocessor 60 provides voltage for the display.

The system further includes a reset circuit 78 for microprocessor 60, and expansion ports, represented generally by reference numeral 79. The expansion ports 79 may be utilized to provide a load control relay and an interface to the power line for communication to a central source through the power line.

An infrared light emitting diode 82 and phototransistor 84 are part of a circuit 86 that provides an infrared light source and reception means for communicating with the meter reader 80. The diode 82 and phototransistor 84 are located within housing 30. They provide, along with the components of the meter reader, infrared serial communication between device 10 and meter reader 80.

Meter reader 80 communicates with microprocessor 60 by means of optical data port 34 in housing 30. Data is transmitted serially in binary form between meter reader 80 and device 10. A standard data rate of 1200 bits per second with one start bit, eight data bits and one stop bit make this system compatible with most computer communications. As noted, a clock circuit is provided for serial bit timing for data transmission between meter reader 80 and microprocessor 60.

The meter reader includes an infrared serial transmitter and receiver such as a light emitting diode and phototransistor. The meter reader further includes a microprocessor, a ROM that stores the program which controls operation of the microprocessor, and a RAM or RAMs for storing the data collected from device 10. Examples of meter readers that may be utilized with the system of the present invention are a Telxon Model PTC 701 hand-held computer available from Telxon Corporation, Akron, Ohio, and a model NTO 121XL available from Norand Data Systems, Cedar Rapids, Iowa.

Reader 80 has a flexible cable 96 that terminates in a suction-type head 98. Head 98, utilizing a suction force, is securable to the glass enclosure 18 opposite port 34 so that the information stored in device 10 may be read by the meter reader.

The meter reader would provide an appropriate infrared signal, such as by means of its microprocessor and light emitting diode, received by phototransistor 84 that instructs microprocessor 60 to begin transmitting the energy use information data stored in its RAMs. The data is transmitted via light emitting diode 82, optical port 34, suction head 98, and the phototransistor meter reader. The energy use information being collected by meter reader 80 may also be displayed at display 94 of the meter reader. A meter location signal is also stored in microprocessor 60 and transferred to the meter reader where it is stored along with the energy use information.

The meter reader reads the usage information and formats the data into a rate structure. The meter reader may be programmed to calculate rate or usage charges utilizing different billing rates for different times of the day or week. Thus, the rate structure may be easily and economically changed by modifying the meter readers, which may only total a few hundred, as opposed to modifying the logic of device 10, which may be installed at literally millions of locations.

The energy use information collected by meter reader 80 may be transferred from the meter reader to a central computer where the rate charge is calculated.

The count relating to the usage information is generally not reset. This enables subsequent verification if there is a question regarding a bill.

Although certain embodiments of the invention have been described herein in detail, the invention is not to be limited only to such embodiments, but rather only by the appended claims.

What is claimed is:

1. A system for use with a watt-hour meter having a rotatable disc for recording energy use, comprising:
    a housing configured to fit within the meter below the disc and securable therein;
    sensor means located within said housing for detecting rotation of the disc and generating a signal in response thereto;
    an optical sensor port in the top surface of said housing through which said sensor means may detect rotation of the disc;
    circuit means within said housing for processing and storing said signal for calculating time of energy use information; and
    communication circuit means within said housing for optically transmitting said time of energy use information to a location external of the meter.

2. The system of claim 1 further including reader means for optically communicating with said communication circuit means to collect said time of energy use infomation for calculation of a rate charge.

3. The system of claim 1 wherein said sensor means comprises first and second light emitting diodes for directing light toward the disc, and first and second phototransistors responsive to a change in the reflective index of the disc.

4. The system of claim 3 wherein said first and second light emitting diodes are operated intermittently.

5. The system of claim 1 wherein said communication circuit means includes a light emitting diode and a phototransistor for infrared serial communication of data.

6. The system of claim 1 wherein said circuit means includes a microprocessor and means for deriving clock pulses from a power supply for said microprocessor so that said microprocessor is clocked in synchronization with the power supply.

7. The system of claim 6 wherein said circuit means further includes a backup source of power for operation of said microprocessor should the power from the power supply drop below a predetermined value.

8. A system for recording time of energy use for use with standard electric meters having a rotatable disc and a substantially optically transparent cup-shaped cover securable to a base to provide an enclosure, comprising:

a housing configured to fit within the cover of any standard electric meter below the disc and securable therein;

sensor means located within said housing for detecting rotation of the disc and generating a signal in response thereto, said housing including an optical port in the top surface thereof through which said sensor means detects said rotation;

circuit means including a microprocessor in said housing for receiving said signal for counting rotations of the disc during an interval of time, determining time of energy use information and storing the same;

a display means on a front face of said housing and visible through the cover for displaying time of energy use information;

communication circuit means included in said housing and connected in circuit with said circuit means for optically transmitting said time of energy use information through the cover to a location external thereof;

an optical data port in the front face of said housing for establishing optical communication between said communication circuit means and said external location; and power supply circuit means within said housing for supplying power to said circuit means and said communication circuit means.

9. The system of claim 8 further including a reader means positionable externally of the cover for optically communicating with said circuit means via said communication circuit means for collecting said time of energy use information for calculation of a rate charge for energy use based thereon.

10. The system of claim 9 wheein said reader means may be programmed for different rate structures in calculating the rate charge.

11. The system of claim 9 wherein said reader means includes a suction head means that is attachable to the cover for establishing an optical communications link between said reader means and said communication circuit means.

12. The system of claim 8 wherein said circuit means includes a read-only memory for storing a program to control the operation of the microprocessor and a random-access memory for storing said time of energy use information.

13. The system of claim 8 or 9 wherein said communication circuit means includes a light emitting diode and a phototransistor for infrared serial communication of data through said optical data port.

14. The system of claim 8 wherein said circuit means includes means for deriving clock pulses from a power supply so that said microprocessor is clocked in synchronization with the power supply.

15. The system of claim 8 wherein said circuit means further includes a backup source of power for operation of said circuit means should the power from the primary power supply drop below a predetermined value.

16. The system of claim 13 wherein said reader means includes a light emitting diode and a phototransistor for said infrared serial communication of data.

17. The system of claim 14 wherein said circuit means includes means for providing clock pulses to said microprocessor should power from the main power supply drop below a predetermined value.

18. The system of claim 15 wherein said backup source of power includes a capacitor circuit.

* * * * *

UNITED STATES PATENT AND TRADEMARK OFFICE
CERTIFICATE OF CORRECTION

PATENT NO. : 4,792,677

DATED : December 20, 1988

INVENTOR(S) : Edwards, et al.

It is certified that error appears in the above—identified patent and that said Letters Patent is hereby corrected as shown below:

Column 2, line 61, "elcctric" should read --electric--

Column 4, line 15, "2a" should read --22a--

Signed and Sealed this

Twenty-third Day of May, 1989

Attest:

DONALD J. QUIGG

Attesting Officer

Commissioner of Patents and Trademarks